(12) United States Patent
Lopez De Meneses et al.

(10) Patent No.: US 9,153,470 B2
(45) Date of Patent: Oct. 6, 2015

(54) WAFER HANDLER COMPRISING A VISION SYSTEM

(75) Inventors: Yuri Lopez De Meneses, Valangin (CH); Damien Coste, Le Locle (CH); Massimo Fauro, Le Landeron (CH); Serge Kunzli, La Chaux-de-Fonds (CH)

(73) Assignee: ISMECA SEMICONDUCTOR HOLDING SA, La-Chaux-de-Fonds (CH)

( * ) Notice: Subject to any disclaimer, the term of this patent is extended or adjusted under 35 U.S.C. 154(b) by 649 days.

(21) Appl. No.: 13/494,121

(22) Filed: Jun. 12, 2012

(65) Prior Publication Data

US 2012/0249773 A1 Oct. 4, 2012

Related U.S. Application Data

(63) Continuation of application No. PCT/EP2010/068055, filed on Nov. 23, 2010.

(30) Foreign Application Priority Data

Dec. 23, 2009 (EP) .................................... 09180715

(51) Int. Cl.
*H04N 5/253* (2006.01)
*H01L 21/68* (2006.01)
*H01L 21/67* (2006.01)

(52) U.S. Cl.
CPC ........ *H01L 21/681* (2013.01); *H01L 21/67144* (2013.01)

(58) Field of Classification Search
CPC . H01L 21/67144; H01L 21/681; H01L 21/68; H01L 21/6741; H01L 21/67259; H01L 21/67271

USPC ........................................................... 348/94
See application file for complete search history.

(56) References Cited

U.S. PATENT DOCUMENTS 6,111,421 A * 8/2000 Takahashi et al. ....... 324/750.04
6,895,109 B1 * 5/2005 Schemmel et al. ........... 382/149
(Continued)

FOREIGN PATENT DOCUMENTS

| JP | 9007977 A | 1/1997 |
|----|-----------|--------|
| JP | 2000-012571 A | 1/2000 |
| WO | 2007/040181 A1 | 4/2007 |

OTHER PUBLICATIONS

International Search Report for PCT/EP2010/068055 dated Feb. 16, 2011.

*Primary Examiner* — Tung Vo
(74) *Attorney, Agent, or Firm* — Maschoff Brennan

(57) ABSTRACT

A wafer handler including, a wafer loading station (3) for loading a wafer (1) mounted on a tack film (2); a tensioner (30) for tensioning the tacky film; a picking module (66) for successively picking a plurality of devices from the wafer; a vision system (5, 50) with one or several cameras (50) for capturing a first image of the wafer or of portions of the wafer, the first image showing a plurality of devices, wherein the vision system is arranged for determining from the first image the individual position of a plurality of devices. The wafer handler further includes an additional camera (63) positioned proximate to the picking module (66) and arranged for capturing an second image of a device to be picked, wherein the second image is used for fine adjustment of the wafer so that the device to be picked is centered under the picking module.

15 Claims, 11 Drawing Sheets

(56) References Cited

U.S. PATENT DOCUMENTS

| | | |
|---|---|---|
| 2004/0261944 A1* | 12/2004 | Wakabayashi et al. .. 156/345.12 |
| 2006/0169208 A1* | 8/2006 | Shinozaki et al. ............ 118/715 |
| 2007/0107656 A1* | 5/2007 | Shinozaki et al. .............. 118/50 |
| 2007/0111536 A1* | 5/2007 | Shinozaki et al. ............ 438/758 |
| 2007/0111542 A1* | 5/2007 | Shinozaki et al. ............ 438/780 |
| 2007/0128364 A1* | 6/2007 | Shinozaki et al. ............ 427/294 |
| 2008/0014073 A1* | 1/2008 | Moore et al. .................. 414/796 |
| 2008/0284455 A1* | 11/2008 | Obikane et al. ............... 324/754 |
| 2008/0290886 A1* | 11/2008 | Akiyama et al. .............. 324/758 |
| 2009/0085594 A1* | 4/2009 | Yamamoto et al. ........... 324/758 |
| 2011/0156734 A1* | 6/2011 | Berry et al. .............. 324/750.19 |
| 2012/0249773 A1* | 10/2012 | Lopez de Meneses et al. 348/94 |

* cited by examiner

```
XOOOOOOOOOOXOOOX
XOOX111111111111
1111111111111111
11111X111X111111
11111111111O11
11O111X11111111
1111111111111111
111111OO111X11X1
111X111111111111
X11111111111111
```

20

Fig. 4 wafer-id
$\theta, X, Y$ $(\theta_{11}, X_{11}, Y_{11}, S_{11})$ ... $(\theta_{1j}, X_{1j}, Y_{1j}, S_{1j})$

⋮ ⋮

$(\theta_{i1}, X_{i1}, Y_{i1}, S_{i1})$ ... $(\theta_{ij}, X_{ij}, Y_{ij}, S_{ij})$

Fig. 6

WAFER HANDLER COMPRISING A VISION SYSTEM

RELATED APPLICATIONS

The contents of European Application No. 09180715.6, filed 23 Dec. 2009, at the European Patent Office is hereby incorporated by reference.

FIELD OF THE INVENTION

The present invention relates to the visual inspection of wafers in the semiconductor industry.

DESCRIPTION OF RELATED ART

Integrated circuits are generally fabricated in a process comprising various imaging, deposition and etching steps, supplemented by doping and cleaning operations. A plurality of devices (the dies, or chips) is often produced on a single slice of silicium called the wafer. Each chip on the wafer is tested using automated test equipment in a process known as the wafer test. As a result of this test, each device in the wafer is classified by quality. In simple tests, the devices are simply classified as "good" or "bad". Sometimes, a finer classification is used, and devices are classified as "first quality", "second quality" and so on.

Before or after this test, the wafer is sawn along streets in order to singulate the different devices. This process is sometimes called wafer dicing, and produces a diced wafer. Dicing can damage the devices and drop particles on their surfaces. Sometimes, bad devices are removed from the diced wafer, producing a partial wafer.

FIG. 1 illustrates a typical diced wafer 1 after this separation process. A wafer can have hundreds, thousands or more than 100,000 devices 10, depending on the size of the wafer and on the dimension of each device. Since the different devices have been separated from each other, they are often adhesively held on a plastic film 2 (sometimes called the tacky film). In the example of FIG. 1, some devices are missing on the tacky film, for example because they have been voluntarily removed after the wafer test, or as a result of different problems which can occur for example during the separation of the chip or during the transport of the tacky film. One speaks about "partial wafer" for designating a diced wafer in which some devices or devices are missing.

Other device production process result in similar sets of singulated devices adhesively mounted on tacky films. In this application, we call those sets of individual devices on a film "wafers"—even when they don't result from singulation of dies in a silicium wafer.

The devices 10 on the wafer are then individually picked at a picking station and packaged in a ceramic or plastic housing to build the final integrated circuit.

It is often necessary to test individually each device of the wafer. This device test is performed after and in addition to the wafer test. A purpose of the device test is to remove the bad devices, i.e. chips having mechanical problems (such as cracks for example) or electrical problems. After this new test, the good devices are for example replaced on the tacky film, or loaded into a device containment system, for example in a transport tubes or into a tape.

FIG. 2 schematically illustrates a typical test arrangement for testing devices in wafers. A plurality of wafers 1 mounted on tacky films form a stack 3 on the right part of the Figure. The wafers are successively loaded from the stack by a wafer feeder 40 that moves them to a test machine 6 on the left part of the figure. In this example, the test machine comprises a turret 65 with a plurality of vacuum nozzles 66 rotating around the turret 65. The devices 10 of the wafer are successively picked by one of the nozzles 66 at a loading station of the test machine, and circulated by the turret through a plurality of test stations 61 for performing a variety of electrical, mechanical and/or optical tests on the devices. The devices which don't pass the tests are removed or marked in order to distinguish them from the good devices. The good devices are replaced after the test on the tacky film, or loaded at an output station in a device containment system. The operation of the test machine 6 is controlled by a processing system, for example a computer workstation 5.

As mentioned, the wafer 1 to be tested can be incomplete and comprises voids, i.e., possible positions which are not occupied by any device. An example of partial wafer with a plurality of voids 13 is illustrated on FIG. 3.

If a wafer test has been made previously, some of the devices 11 present in the wafer may already have been identified as bad (or inked). Additionally, wafer often comprises particular devices 12, called fiducial devices, with special marks for alignment of the wafer—those particular devices are usually not used, and do not need to be picked. The wafer, or the film 2 on which the wafer is mounted, is sometimes provided with some marks (not shown), for example a barcode or a 2D datamatrix, for identifying the particular wafer. The references 10 on FIG. 3 correspond to "pickable" devices, i.e., devices which are a priori good and need to be tested. Known-bad devices don't need to be picked and tested.

As can be seen on the Figure, not all the positions of the wafer are filled with pickable devices 10. Since the test machine 6 does not know the position of the pickable devices 10, it often tries to pick known-bad devices 11, fiducial devices 12 or devices form void positions 13. The picking and test from those position reduces the throughput, i.e., the number of significative tests which the test machine 6 can perform each hour or each day.

In order to solve partially this problem, the use of a wafer map that indicates the number of devices in the wafer and the positions of the pickable devices has already been suggested. Such a wafer map can be generated during the wafer test, for example before the wafer is diced. It often consists in a simple ASCII file in which the status of each device, as previously determined for example during wafer test, is specified by a letter.

An example of wafer map 20 corresponding to the partial wafer of FIG. 3 is shown on FIG. 4. In this example, the wafer map comprises a matrix with the same number of lines and columns than the wafer to which it corresponds. Each knownbad device, including in this example fiducial devices, is indicated with an X; each void (position without any device) is marked with a zero ("0"). The "1" indicate the positions of the pickable devices, i.e., a priori good devices which are worth picking and testing.

This wafer map is often stored in a file 21 which can be loaded by a suitable software program in the workstation 5. The workstation uses this information to control the displacements of the wafer under the test machine 6, in order to pick and test devices only from the pickable positions marked with a "1" in this example of wafer map.

In practice, the use of wafer maps often creates a number of drawbacks. First, wafer maps are often generated during wafer test at a different location, for example in a different factory or different room, than the location where the individual device test is made. The wafer map thus needs to be transferred from this remote location and loaded in the workstation 5. Situations occur that a wafer map is lost, or not received in time for the device test of the corresponding wafer. In this case, the test machine 6 needs to proceed without this data and try all the possible locations for devices on the wafer, resulting in a slow test process.

It also happens that wafer maps and wafers are mixed-up, and that a wafer map that does not correspond to the currently tested wafer is loaded in the workstation 5. In this case, the test machine 6 may try to pick devices from void positions, or test bad devices which are already known as being bad or missing, or ignore potential good devices.

Moreover, common wafer maps 20 only indicate which cells in a matrix corresponding to the wafer are occupied by good and bad devices; they don't give the orientation and position of the pickable devices. In operation, it often happens that devices are slightly misplaced on the tacky film 2, for example shifted and/or rotated with respect to the expected location. In this case, the vacuum nozzle 66 at the loading station of the test machine may have difficulties in reliably picking a misplaced or disorientated device. An additional camera is sometimes provided near this picking nozzle in order to correct the orientation and position, and to center the device under the nozzle. The field of view of this camera is necessarily small and does not encompass a strongly displaced device very far away from the expected position; thus, only minor corrections can be performed at this stage.

Cameras are also often used for aligning and centering the wafer based on the position of the fiducial devices and other marks; those cameras only deliver the overall position and orientation of the wafer, but not the individual position and orientation of each device.

The problem is even worse when the devices or devices have small dimensions, for example a surface of the upper face smaller than 1×1 mm. In this case, the risk of picking error is extremely high. Indeed, the picking nozzle must travel a large distance relative to the wafer in order to pick the first device or device on the wafer. The accumulated error during this initial displacement can be very high, and it happens that the picking nozzle starts with a neighbor of the first pickable device, instead of picking the intended first device. Since the first device is not the good one and the wafer is shifted by one device after each pick, the sequence of picking can be entirely shifted.

It is therefore an aim of the present invention to provide an arrangement and a method for solving those problems of the prior art.

JP 2000 012571 discloses a positioning method in which a plurality of semiconductor chips in a retaining sheet are recognized by a first camera of a low magnifying power, and one semiconductor chip in which it is judged that there are no inferior marks by the above recognition is recognized by a second camera of a high magnifying power, and an XY table is operated, based on this recognition so that the one semiconductor chip is positioned for pick-up by a pick-up means. In the device disclosed in JP 2000 012571 the first image is used to detect which chips do not possess inferior marks only; the first image is not suitable for determining the individual position of a plurality of chips. In fact the apparatus of JP 2000 012571 requires that a second image be taken by a second camera of high magnifying power in order to determine the individual position of a plurality of chips on the semiconductor chip. No means for fine adjustment of the position of the wafer under the pick-up means is provided in the device of JP 2000 012571; the XY table is moved for the first and only time based on the recognition by the second camera of high magnifying power; since the first image is not used to first position the XY table so that the chips to be picked is in the general area of the pick-up means, the XY table is forced to undergo large movements based on the image taken by the second camera, so that the recognized device is positioned in the general region of the pick-up means for pick-up. There is also no mention of fine correction of the XY table. Thus, positioning of the device to be picked under the pick-up means is slow and accurate positioning of said device to be picked is also not achievable with the apparatus of JP 2000 012571.

BRIEF SUMMARY OF THE INVENTION

According to the invention, these aims are achieved by means of a wafer handler comprising a wafer loading station for loading a diced wafer mounted on tacky films, a tensioner for tensioning the tacky film, a picking module for successively picking a plurality of devices from said wafer, a vision system with one or several camera for capturing a first image of the wafer or of portions of said wafer, said first image showing a plurality of devices, wherein said vision system is arranged for determining from said first image the individual position of a plurality of devices, wherein the wafer handle further comprises an additional camera positioned proximate to said picking module and arranged for capturing an second image of a device to be picked, wherein the second image is used for fine adjustment of the wafer so that the device to be picked is centered under the picking module.

This provides the advantage of verifying the wafer, and preparing a location map of this wafer, just before devices are picked from the diced wafer, thus avoiding the risks of mix-up when using a wafer map that was previously established at a different location. Since the same machine is used for generating the wafer position map and for picking the devices from this wafer, the risk of using the wrong wafer map for controlling the picking machine is entirely avoided.

Furthermore, the rough positions of pickable devices can be retrieved from the first image so that the wafer can be moved very quickly and directly to an position which ensures that the picking module is positioned roughly in the region of the pickable devices; the second image may then be used to permit fine correction of the alignment and orientation of the wafer so that the device to pick is centering under the picking module. Thus, the advantage of the present invention is that it allows fast location of the device to be picked, while also permitting accurate positioning of said device to be picked so that it is in the optimum position for pick-up.

In one embodiment, the vision system is arranged for determining from the first image the individual position and orientation of a plurality of devices, or even of all devices present on the tacky film. Thus a single image is used for determining the position of and orientation of each device, thus avoiding the drawbacks and time that would be needed for capturing an individual image of each device to pick.

The image captured by the vision system can be used among other for controlling the picking module. In one embodiment, the wafer is moved by a wafer displacement unit in order to center successively each device to pick under the picking module, for example under a vacuum nozzle. The successive displacements of the wafer are preferably controlled by the vision system and depend on the first image, in order to move the wafer along the shortest path through the list of pickable positions.

In one embodiment, a second high resolution image of the device to pick is captured when this device has been moved under the picking module. This second image is used for fine adjustment and centering of the wafer under the picking module; preferably, the field of view of this second image is much smaller than the one of the first image, and shows only the device to pick, or this device and its direct neighbour. Since the rough positions of pickable devices can be retrieved from the first, large view image, there is no time lost in capturing images from non pickable positions, and the wafer can be moved very quickly and directly to the rough positions of the pickable devices, where a second high resolution image with a narrow field of view is taken for fine correction of the alignment and orientation.

In one embodiment, the tacky film on which the diced wafer is placed comprises a code, such as a bar code or a datamatrix. The first image taken by the vision system encompasses this code, which is decoded. The vision thus generates data that depends on the position and/or orientation of the wafer, on the individual position and/or orientation of each device in the wafer, and accompanying metadata depending on said code. In one embodiment, the code contains an identification of the wafer—

BRIEF DESCRIPTION OF THE DRAWINGS

The invention will be better understood with the aid of the description of an embodiment given by way of example and illustrated by the figures, in which:

FIG. 4 is an example of wafer map according to the prior art.

FIG. 6 illustrates an example of data generated by the vision system of the invention.

DETAILED DESCRIPTION OF POSSIBLE EMBODIMENTS OF THE INVENTION

In this description and in the claim, the term "wafer" designates any complete or partial wafer, usually of silicium or in any other semiconductor element. The wafer can be in one piece, or diced (sawn/singulated) when the different devices are separated from each other. The expression "wafer" is also used in this application for designating other sets of pickable devices which can be picked one after the other for test and further handling. This includes without any limitations:

wafer ceramic frames;

repopulated (or reconstructed) wafers in which devices from one or several wafers are placed on a tacky film with a different arrangement than the initial ones; and other devices such as QFN devices manufactured from a lead frame strip and using a molding process, placed on a tacky film, and singulated.

All those different and other similar arrangements of singulated devices on a tacky film are called "wafer" in the application.

Figure 1:
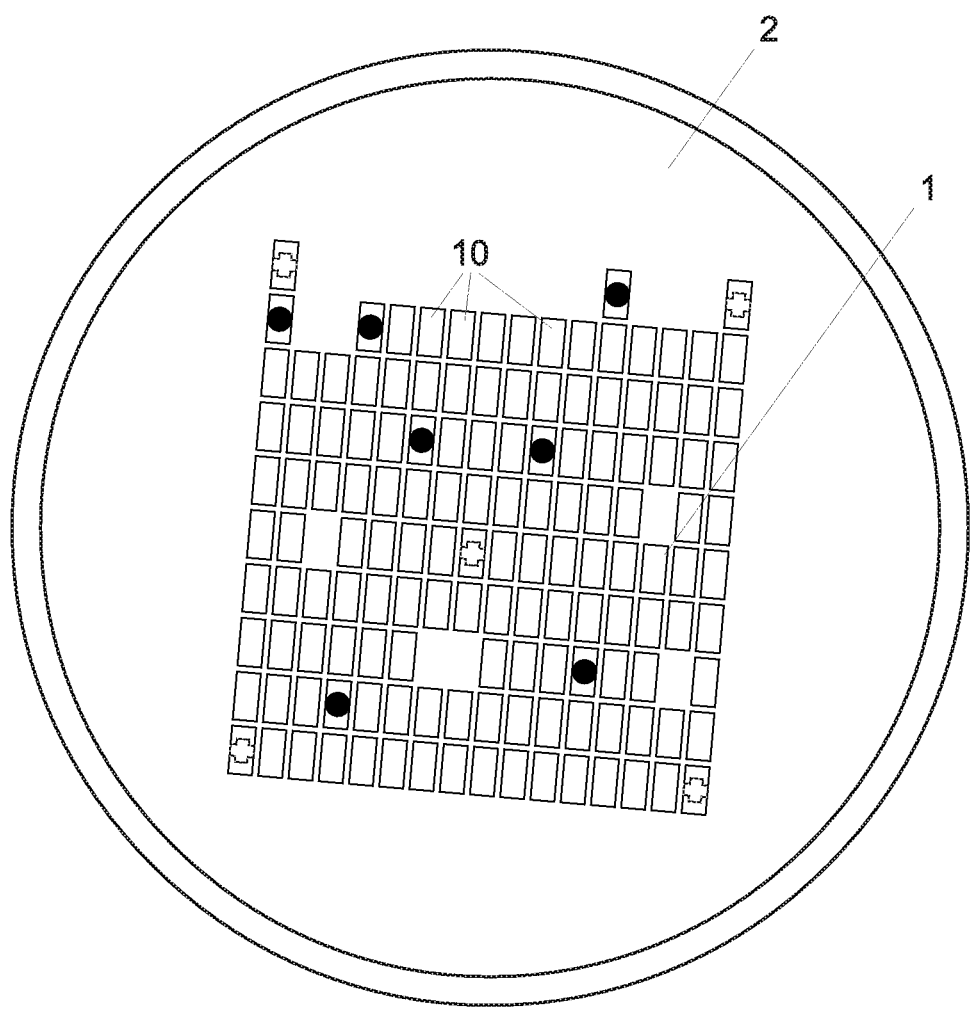
FIG. 1 is a view of a wafer on a tacky film.
Figure 2:
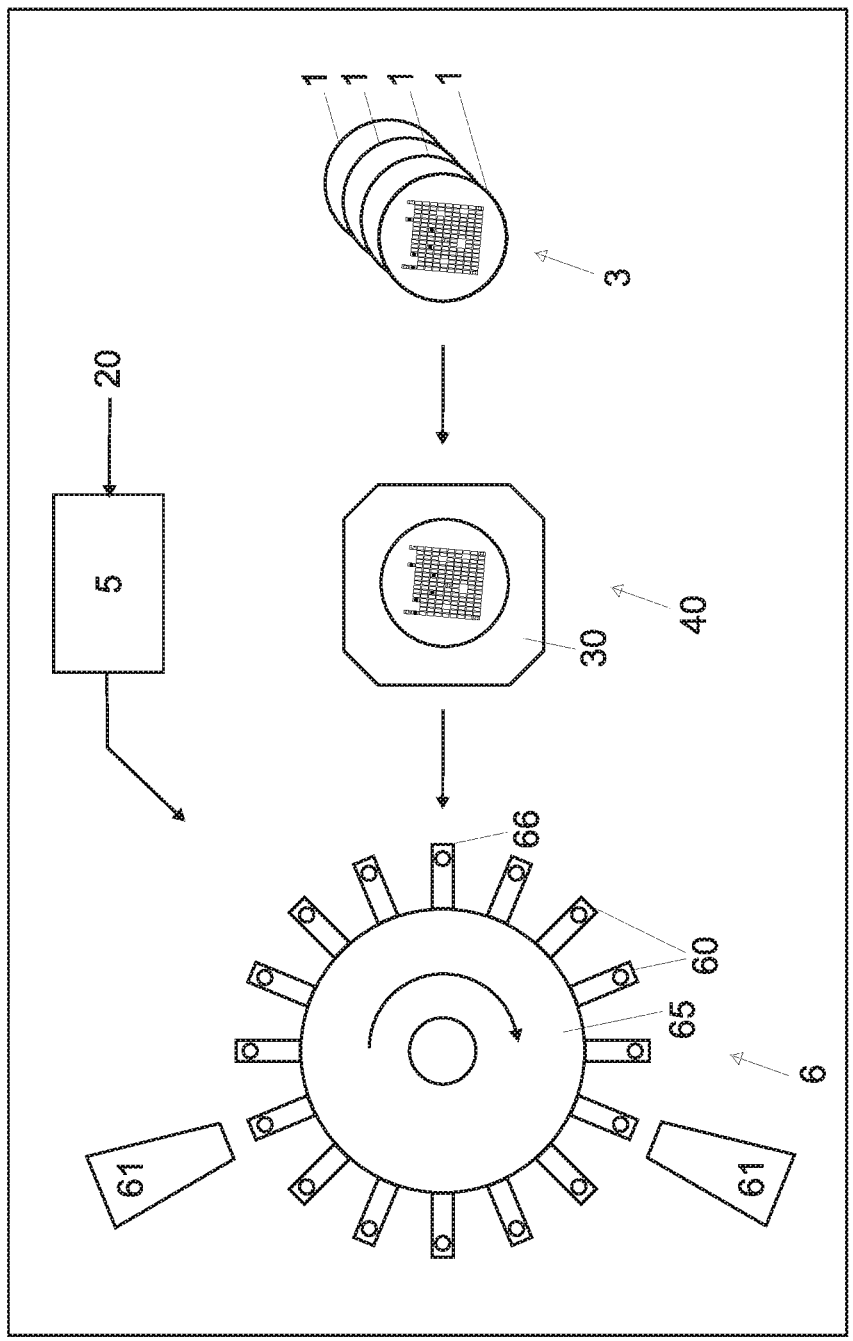
FIG. 2 shows a schematic view of a conventional wafer handler, in which the picking module is controlled by a previously determined wafer map.
Figure 3:
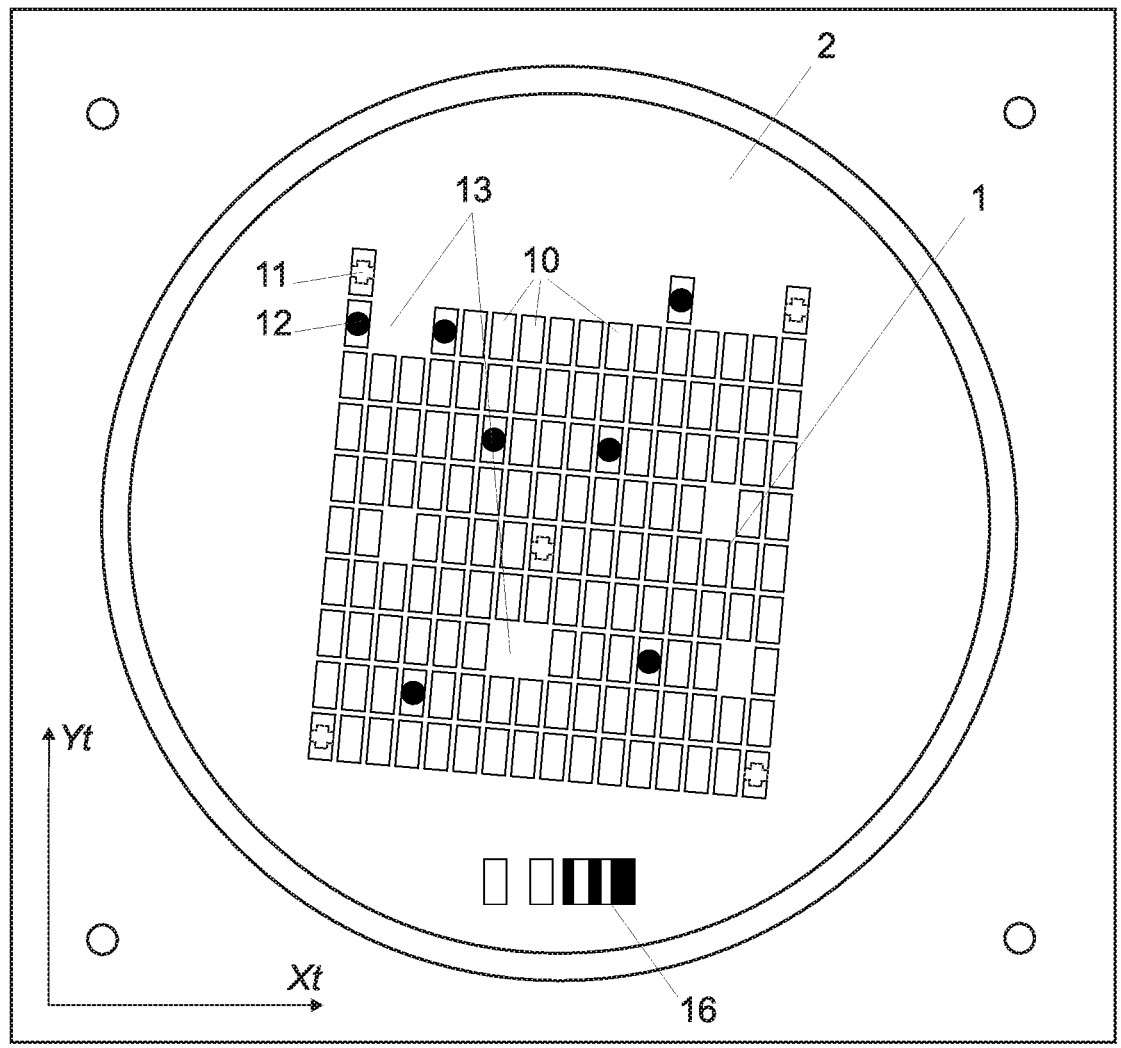
FIG. 3 is a view of a wafer on a tacky film, showing the pickable positions, some inked positions corresponding to bad devices, some positions corresponding to missing devices, and some fiducial devices.
Figure 5:
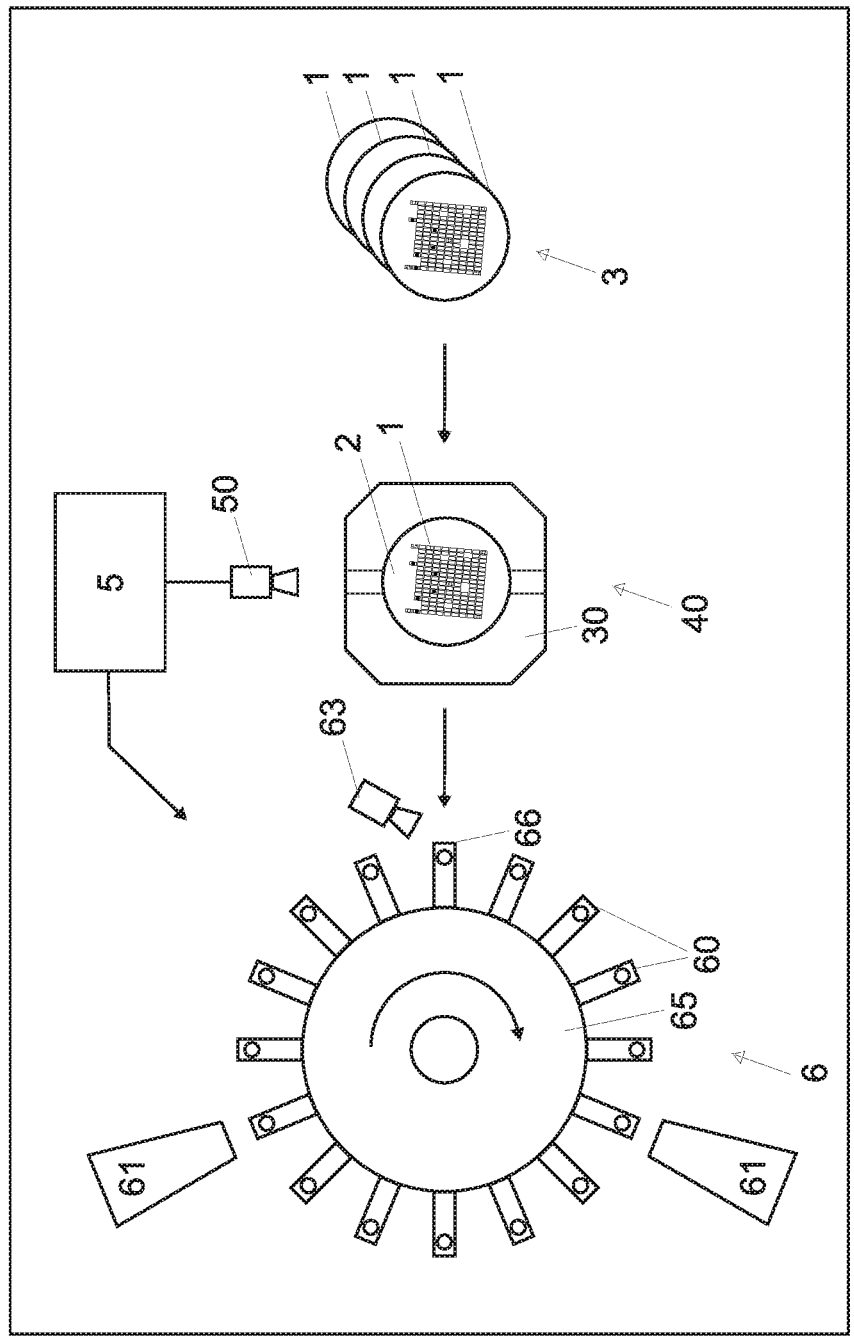
FIG. 5 is a schematic view of a wafer handler according to the invention, in which the picking module is controlled by a previously determined wafer map.

FIG. 5 schematically illustrates a wafer handler according to the invention. The illustrated arrangement comprises a wafer loader 3 where a plurality of wafers 1 with devices to be tested form a stack 13 on the right part of the Figure. The wafers 1 in this stack are successively seized and transferred with a wafer feeder 40 to the test machine 6 on the left part of the Figure. The reference 30 designates a tensioner, i.e., an equipment for tensioning the tacky film on which the wafer is adhesively mounted, in order to hold it rigid and flat. The tensioner may comprise an adjustable frame that holds the film.

The test machine 6 comprises in this example a rotating turret 65 with a plurality of picking modules 66, for example vacuum nozzles 66 for holding the devices under the turret using a depression. The devices held by the vacuum nozzles are moved from one test station 61 to the next when the turret is indexed in its rotation. The tests may comprise for example electrical, mechanical and/or optical tests. The devices may comprise for example dies or packaged devices such as, without limitation, LEDs or QFN components.

A first camera 50 captures an image of the diced wafer 1 on the tacky film during its transfer on the wafer feeder 40 from the wafer loading station 3 to the turret 6. The camera 50 is preferably an industrial video camera with a relatively low resolution and wide angle lens, able to capture an image of the whole wafer. Several cameras, for example four cameras, may be mounted next to each other in order to capture an image of very large wafer, such as 12" wafers. In another embodiment, the same camera is moved relatively to a large wafer in order to capture a single high resolution first image of the wafer in a plurality of successive steps. Preferably, multiple images of the same wafer or wafer portion are successively captured under different lighting conditions, and merged to produce a more informative high resolution image.

The camera 50 is connected to an image and data digital processing system 5, both elements 5 and 50 forming in combination the vision system. This vision system generates from the first image a wafer location map, i.e., a file or data that indicates at least the rough position and/or orientation of each device of the wafer. In this context, a position determination is said to be rough if the error is between 0.25 and 2 times the size of an individual device.

The vision system 5, 50 preferably also determines and adds additional metadata to the wafer location map, including for example the time, the identification of the machine, and/or data decoded from a code such as a bar code or datamatrix on the tacky film which can identify a particular wafer, particularly if it belongs to a particular manufacturing batch, lot or order.

In addition to the code 16, the tensioner or the tacky film hold by the tensioner can comprise one or several markers which can be recognized by the vision system and used for positioning the tensioner when it moves from the wafer the loader to the turret, and under the turret.

The wafer location map generated by the vision system 5, 50 is used by the test machine 6 for positioning and orienting the wafer under a picking module 66 at a loading station 72 where devices are successively picked from the wafer. In a preferred embodiment, an additional higher resolution camera 63 is provided for capturing a narrow second image of the devices under the picking module 66 and for performing fine positional adjustment and centering of each successive device to pick.

Thus, in one embodiment, the first image captured by camera 50 is used for rough displacement of the wafer, in order to successively place the pickable positions under the input nozzle 66. Fine centering and adjusting is based on image captured with the second camera 63. One advantage of the first camera 50 is thus to avoid moving the wafer at positions under the picking nozzle 66 where no devices, or no good devices, are present.

The devices of the wafer are successively picked by one of the nozzles 66 at the loading station 72 of the test machine 6, and circulated by the turret 65 in order to pass through a plurality of test stations 61 for performing a variety of electrical, mechanical and/or optical tests. The devices which don't pass the tests are removed or marked in order to distinguish them from the good devices. The operation of the test machine 6 is controlled by the wafer location map produced by the vision system 5, 50.

An example of wafer location map is illustrated on FIG. 6. The map is stored in a computer file which preferably comprises a wafer identification (wafer-id) retrieved for example from a code or datamatrix, a wafer orientation and position indication θ, X, Y indicating the global position and orientation of the wafer 1 on the tacky foil 2, and a matrix of device orientation and position indication $\theta_{ij}$, $X_{ij}$, $Y_{ij}$ for indicating the orientation and position or each individual device of the wafer. Optionally, a quality indication $S_{ij}$ indicates a quality associated with each device, for example if the device is good, inked (bad), fiducial or of a particular quality.

The wafer location map of FIG. 6 is a simple ASCII file; other file structures may be preferred, including XML files, or storage as records in a database system for example.

Figure 7:
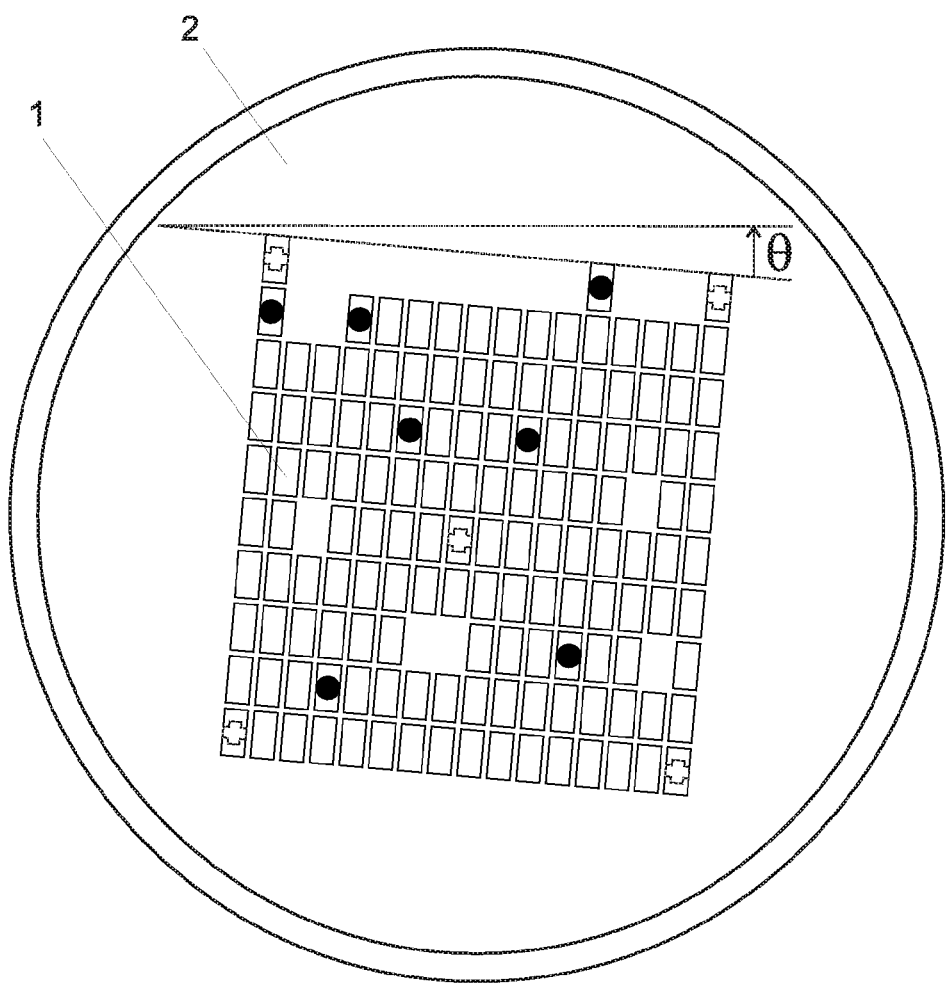
FIG. 7 is a view of a wafer on a tacky film, showing the overall inclination angle of the wafer.

FIG. 7 illustrates the global orientation angle θ that defines the global orientation of the wafer 1 on the tacky film 2. This angle is preferably determined by the vision system 5,50 and stored in the wafer location map; it can be used by the picking module for scanning the successive rows (or columns) of devices along the correct orientation.

Figure 8:
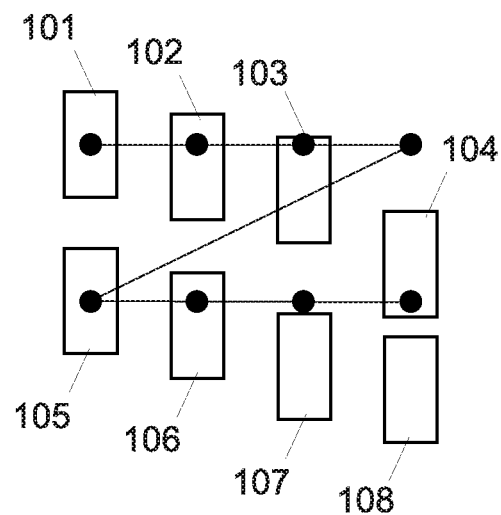
FIG. 8 is an enlarged view over a few misaligned devices in a wafer.

FIG. 8 illustrates two successive rows of devices 101-104 and 105-108 in a wafer. Inaccuracies in pick-and-place equipment may shift or rotate the devices when the equipment places them on the tacky film. Therefore, as illustrated, the positions of the devices on the tacky film may differ in position and orientation from the expected ones. In the example, the devices are misaligned and displaced along the vertical axis Y. If the picking module 66 of the test station 6 picks the device along the Z-shaped line illustrated on the figure, the first devices 101 and 102 will be correctly picked; the third device will be seized very close to its edge, and may tilt. The next device 104 won't be picked during scanning of the first row.

The devices 105 and 106 will be correctly picked, but 107 and 108 will be missed; the device 104 belonging to the first row will be picked instead of 108. This shows that misalignment of the devices on the wafer may lead to failed picks, and mix up of devices. Therefore, correction of the wafer position under the picking module 66 is useful for compensating those errors.

Figure 9:
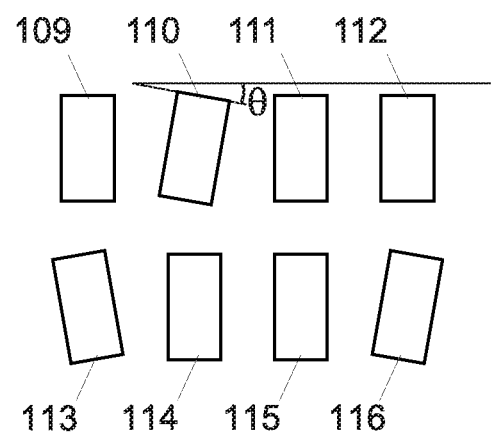
FIG. 9 is an enlarged view over a few misoriented devices in a wafer.

Independently of the global misorientation of the wafer, each device i, j may have its own orientation error $\theta_{ij}$ as indicated on FIG. 9. This individual orientation can be determined (at least roughly) by the vision system and stored in the wafer location map, in order to center and orientate the device (for example a device) under the picking nozzle.

Figure 10:
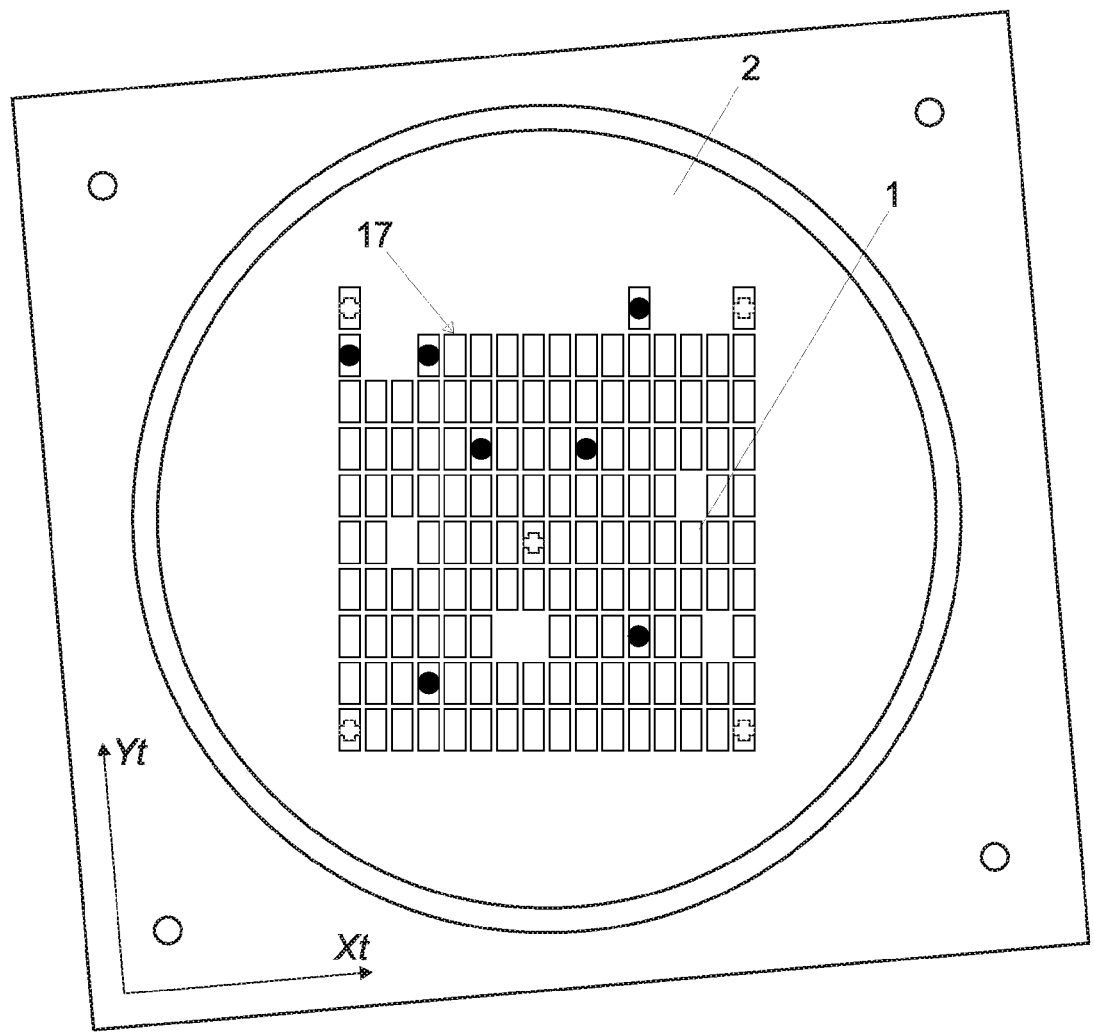
FIG. 10 is a view of a wafer on a tacky film, showing the position of the first pickable device.

The wafer location map preferably also indicates the position of the first pickable device 17 as indicated on FIG. 10. Thus, the initial placement of the wafer under the picking module is very fast and based on this indication. Successive displacements from this initial position to the following pickable devices are made along a trajectory determined by the vision system in order to minimize the total displacement time.

Figure 11:
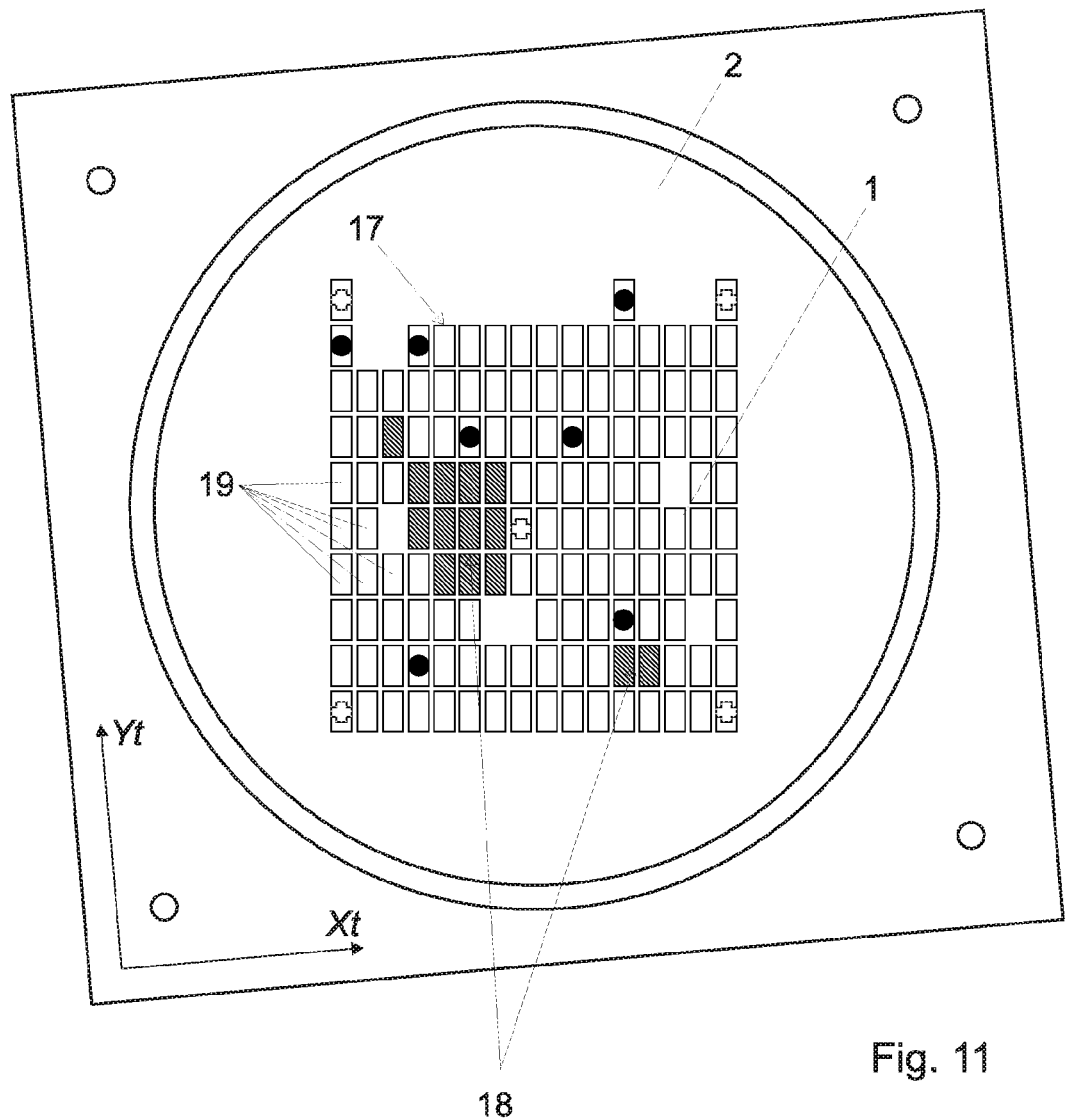
FIG. 11 is a view of a wafer with two on a tacky film, wherein the wafer comprises two types of devices with two different, previously identified qualities.

It frequently happens that different types of devices are present on the same wafer, for example devices or other types of devices in two different qualities 18, 19. In this case, it is often desired to perform first the picking and test of first type/quality of devices 18, and then the picking and test of the next types 19. An example of wafer with two different qualities of devices is shown on FIG. 11.

The quality of devices may have been determined previously, for example during wafer test, and indicated in the wafer map 20. This data in this wafer map may be introduced (when available) in the vision system 5, and merged with the wafer location map delivered by the vision system, in order to provide a quality factor $S_{i,j}$ for each device, as indicated on FIG. 6. This quality factor may be used for determining the sequence in which the devices are picked.

The vision system 5,50 can also verify the coherence of the indications in the wafer map 20 and the generated wafer location map, and check for example if the number of rows/columns, the position of the missing or fiducial devices etc correspond; an error message will be generated if the data do not correspond, and the merge is not realized.

Very often, the good devices are output at an output station after their testing, and the bad devices are rejected. When the test machine has picked and tested all the pickable devices from the wafer, this wafer is moved backward by the wafer feeder 40 and a new image of the wafer is captured by the vision system 5, 50. The wafer from which nearly all devices have been picked from is often called the "skeleton". The vision system 5, 50 produces another file, the output view map, from this image of the skeleton. This output view map is compared with the expected result, and incoherencies or mistakes are detected.

Figure 12:
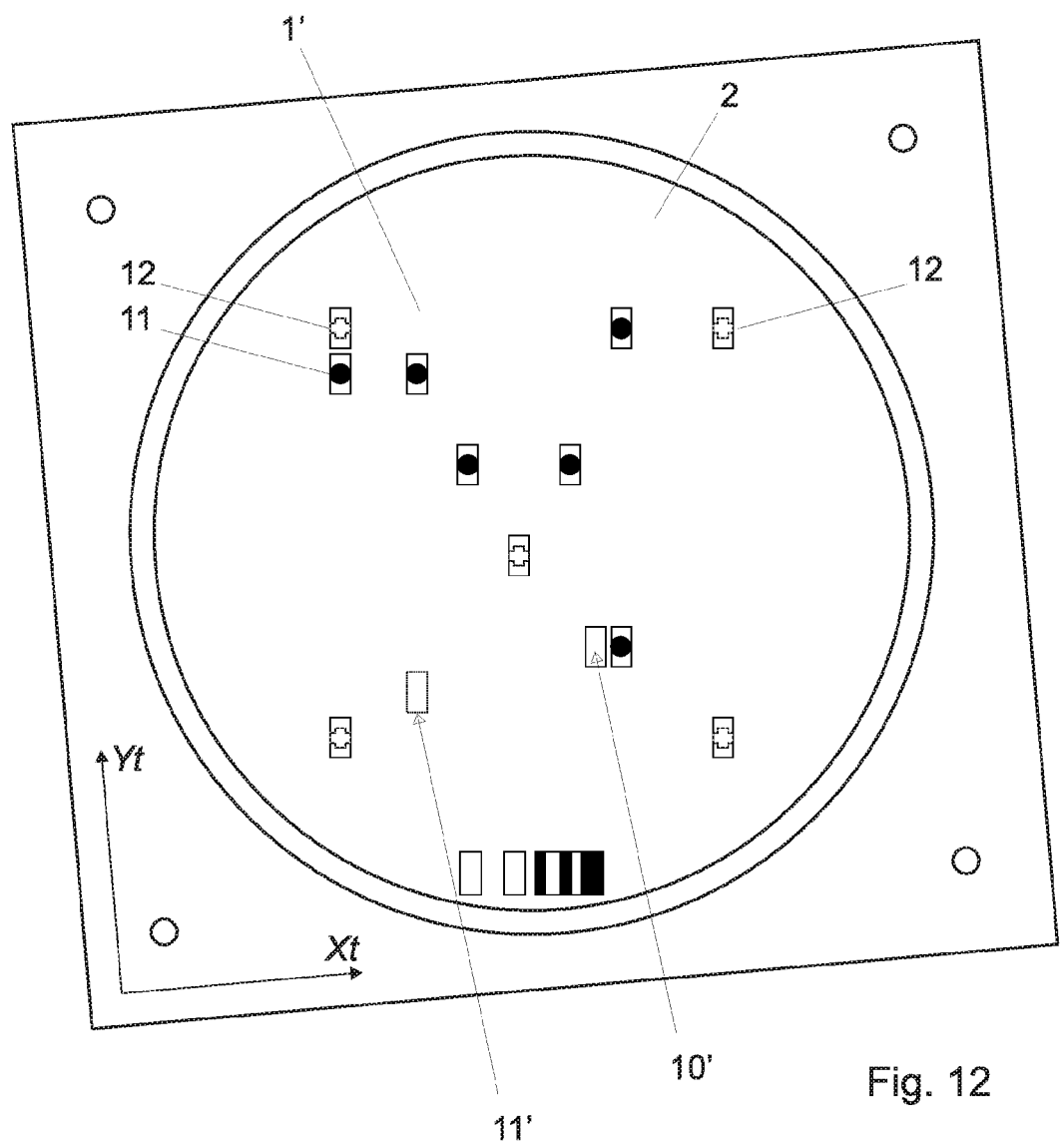
FIG. 12 is a view of a wafer on a tacky film, showing the "skeleton" that remains after the picking operation.

FIG. 12 shows an example where one inked device 11' (i.e., a device which was supposed to be bad) is missing, while a pickable device 10' has been left. The operator, or a computer software, can use this information in the output view map to check that all inked and fiducial devices are there, and that no pickable devices have been forgotten. If too many errors are present, an operator validation is demanded.

The invention claimed is:
1. A wafer handler comprising:
a wafer loading station for loading a wafer mounted on a tack film;
a tensioner for tensioning the tacky film;
a picking module for successively picking a plurality of devices, each of which have an orientation, from said wafer;
a vision system with a first camera for capturing a first image of said wafer or of portions of said wafer, said first image comprising a plurality of devices, wherein said vision system is arranged for determining from said first image the individual position of a plurality of devices and wherein the first image is used to move the wafer roughly to the position of a device to be picked, and wherein said vision system is configured to generate from the first image a wafer location map which indi- cates the orientation of the wafer, and the rough position and orientation of the each device on the wafer, and wherein the wafer handler further comprises a second camera positioned proximate to said picking module and arranged for capturing a second image of a device to be picked, wherein the second image and the wafer location map are used for fine adjustment of the wafer so that the device to be picked is centered under the picking module; and wherein said first camera is arranged for capturing the first image during the transfer of the wafer from the wafer loading station to under the picking module, and said second camera is arranged for capturing the second image when the wafer has been located under the picking module.

2. The wafer handler of claim 1, wherein said picking module comprises:
one wafer displacement unit for displacing said wafer under said picking module, so as to center and align the device to pick under said picking module;
wherein a wafer location map generated by said vision system is used in the control of said wafer displacement unit.

3. The wafer handler of claim 1, comprising a code on said tacky film for identifying said wafer,
wherein said vision system is arranged for generating data depending on said code and on the individual position of each device on said tacky film,
wherein said data is used in the control of the displacements of said wafer.

4. A method for handling wafers, comprising:
loading a wafer mounted on a tacky film;
tensioning said tacky film;
capturing a first image of said wafer on said tacky film, said first image displaying a plurality of devices;
using said first image in the control of successive picking of devices from said wafer by determining from said first image the individual position of a plurality of devices in said partial wafer,
capturing a second image of the wafer,
using the second image for fine adjustment of the wafer so that a device to be picked is centered under the picking module, determining from said first image the individual orientation of a plurality of devices in said wafer; and
wherein said first camera is arranged for capturing the first image during the transfer of the wafer from the wafer loading station to under the picking module, and said second camera is arranged for capturing the second image when the wafer has been located under the picking module.

5. The method of claim 4, further comprising displacing said wafer under said picking module, so as to center and align the device to pick under a picking module;
wherein said first image is used in the control of said wafer displacement.

6. The method of claim 4, further comprising generating data depending on a code on said tacky film and on the individual position of each device on said tacky film.

7. The method of claim 6, said data further indicating the overall position and/or orientation of said wafer on said tacky film.

8. The method of claim 6, said data further indicating the position of the first pickable device on said tacky film.

9. The method of claim 4, further comprising:
providing a wafer map that indicates a quality parameter of each device in said wafer,
generating data depending on said first image and on said wafer map for indicating the position, orientation, and quality parameter of each device.

10. The method of claim 4, further comprising:
capturing a third image of the wafer once said devices have been picked;
verifying with said third image if the devices that remain on said tacky film correspond to the expectations based on said first image and/or on said wafer map.

11. The method of claim 4, further comprising:
providing said tensioner with at least one marker;
capturing an image including said marker;
positioning said tensioner based on said image.

12. A wafer handler comprising:
a wafer loading station for loading a wafer mounted on a tack film;
a tensioner for tensioning the tacky film;
a picking module for successively picking a plurality of devices, each of which have an orientation, from said wafer;
a vision system with a first camera for capturing a first image of said wafer or of portions of said wafer, said first image comprising a plurality of devices, wherein said vision system is arranged for determining from said first image the individual position of a plurality of devices, and wherein the first image is used to move the wafer in a first movement roughly to the position of a device to be picked, and wherein said vision system is configured to generate from the first image a wafer location map which indicates the orientation of the wafer, and the rough position and orientation of the each device on the wafer, and wherein the wafer handler further comprises a second camera positioned proximate to said picking module and arranged for capturing a second image of a device to be picked, wherein the second image and the wafer location map are used to move the wafer in a second movement which is finer than said first movement, for fine adjustment of the wafer so that the device to be picked is centered under the picking module; and
wherein said first camera is arranged for capturing the first image during the transfer of the wafer from the wafer loading station to under the picking module, and said second camera is arranged for capturing the second image when the wafer has been located under the picking module.

13. A method for handling wafers, comprising:
loading a wafer mounted on a tacky film;
tensioning said tacky film;
capturing a first image of said wafer on said tacky film, said first image displaying a plurality of devices;
using said first image in the control of successive picking of devices from said wafer by determining from said first image the individual position of the plurality of devices in said wafer,
determining from said first image the individual orientation of a plurality of devices in said wafer;
capturing a second image of the device to pick,
using the first image to move the wafer in a first movement so that the device to pick is moved towards a position under the pick-up module, and using the second image to move the wafer in a second movement which is finer than said first movement, for fine adjustment of the wafer so that a device to be picked is centered under the picking module; and
wherein said first camera is arranged for capturing the first image during the transfer of the wafer from the wafer loading station to under the picking module, and said second camera is arranged for capturing the second image when the wafer has been located under the picking module.

14. A wafer handler according to claim 1 wherein the vision system is further configured to,
   capture an image of the wafer after the picking module has picked one or more devices from the wafer, and wherein the wafer handler further comprises a processor which is configured to,
   compare the captured image of the wafer to an expected result to identify if all devices, which should have been picked by the picking module from the wafer, have been picked; and
   determine a number of error made by the picking module based on the comparison between the captured image to an expected result.

15. A method for handling wafers according to claim 4 wherein the method further comprises the steps of,
   capturing an image of the wafer after one or more devices have been picked from the wafer;
   comparing the captured image of the wafer to an expected result to identify if all devices, which should have been picked from the wafer, have been picked; and
   determining a number of errors made based on the comparison between the captured image and expected result.

* * * * *